United States Patent
Inoue

(10) Patent No.: US 7,298,230 B2
(45) Date of Patent: Nov. 20, 2007

(54) DUPLEXER UTILIZING A COMPACT SPLITTER CIRCUIT

(75) Inventor: Kenji Inoue, Tokyo (JP)

(73) Assignee: TDK Corporation (JP)

( * ) Notice: Subject to any disclaimer, the term of this patent is extended or adjusted under 35 U.S.C. 154(b) by 793 days.

(21) Appl. No.: 10/785,655

(22) Filed: Feb. 24, 2004

(65) Prior Publication Data

US 2005/0093648 A1 May 5, 2005

(30) Foreign Application Priority Data

Nov. 5, 2003 (JP) ............... 2003-376254

(51) Int. Cl.
*H03H 9/70* (2006.01)
*H03H 9/72* (2006.01)

(52) U.S. Cl. .............. 333/133; 333/132; 333/134; 333/126; 333/129

(58) Field of Classification Search ............... 333/133, 333/126, 129, 132, 193, 187
See application file for complete search history.

(56) References Cited

U.S. PATENT DOCUMENTS

| | | | | |
|---|---|---|---|---|
| 5,789,845 A | * | 8/1998 | Wadaka et al. ............. | 310/334 |
| 6,201,457 B1 | * | 3/2001 | Hickernell ................... | 333/193 |
| 6,937,113 B2 | * | 8/2005 | Ohashi et al. ............... | 333/133 |
| 6,975,180 B2 | * | 12/2005 | Nakamura et al. .......... | 333/133 |

FOREIGN PATENT DOCUMENTS

| | | | |
|---|---|---|---|
| JP | 7-38376 | * | 2/1995 |
| JP | 2001-024476 | | 1/2001 |
| JP | 2004-23655 | * | 1/2004 |

* cited by examiner

*Primary Examiner*—Barbara Summons
(74) *Attorney, Agent, or Firm*—Young Law Firm, P.C.

(57) ABSTRACT

The duplexer includes a transmit filter connected between an antenna terminal and a transmit terminal, and a splitter circuit and a receive filter connected in series between the antenna terminal and the receive terminal. The splitter circuit includes at least one phaseline connected between the antenna terminal and the receive filter and at least one resonator connected in parallel with the phaseline. According to the present invention, the length of the phaseline can be made shorter, so the entire duplexer can be made more compact in size. In addition, an inductors are preferably connected between each ends of the phaseline and the resonator. In this case, the inductance of a wire or via formed within the package can be used.

16 Claims, 5 Drawing Sheets

DUPLEXER UTILIZING A COMPACT SPLITTER CIRCUIT

TECHNICAL FIELD

The present invention relates to a duplexer and particularly to a duplexer with a compact splitter circuit.

BACKGROUND OF THE INVENTION

Duplexers that divide transmit signals and receive signals are widely used in conventional mobile communications equipment, typified by mobile telephones. A duplexer basically includes a transmit filter connected between the antenna terminal and transmit terminal, and a splitter circuit and receive filter connected between the antenna terminal and receive terminal in series. The splitter circuit contained in the duplexer is used to isolate the effects that the transmit/receive signals have on the circuits of the other party, and thus the transmit signals sent from the transmit terminal are sent to the antenna terminal without reaching the receive terminal, and the receive signals sent from the antenna terminal are supplied to the receive terminal without reaching the transmit terminal.

A splitter circuit used in a duplexer typically includes an ordinary LC circuit and a quarter-wavelength phaseline. (See Japanese Patent Application Laid Open No. 2001-24476.)

However, if the splitter circuit used in a duplexer is composed of an LC circuit and quarter-wavelength phaseline, this results in a problem wherein it impedes attempts to make the duplexer more compact. Namely, in a splitter circuit that uses an LC circuit, the inductor (L element) and capacitor (C element) are of a large size, so a plurality of electrode pads are required for mounting and thus it is intrinsically difficult to make the circuit more compact. In addition, in a splitter circuit that uses a quarter-wavelength phaseline, when a substrate with a dielectric constant of approximately 7, for example, is used, a phaseline of approximately 10 mm is required in the 2 GHz band, so the size is considerably large in comparison with transmit filters or receive filters that can be implemented with a size of roughly 1-1.5 mm square, respectively, in the same frequency band.

As is apparent from foregoing, in order to make the duplexer more compact, it is necessary to make the splitter circuit contained therein more compact.

SUMMARY OF THE INVENTION

It is therefore an object of the present invention to provide a compact, high-performance duplexer by making improvements to the splitter circuit.

The above and other objects of the present invention can be accomplished by a duplexer, having an antenna terminal, a transmit terminal and a receive terminal, comprises a transmit filter connected between the antenna terminal and the transmit terminal, and a splitter circuit and a receive filter connected in series between the antenna terminal and the receive terminal, wherein said splitter circuit includes at least one phaseline connected between said antenna terminal and said receive filter and at least one resonator connected in parallel with said phaseline.

According to the present invention, the length of the phaseline contained in the splitter circuit can be made much shorter than in the prior art, so the entire duplexer can be made more compact in size.

In a preferred aspect of the present invention, said splitter circuit further includes a first inductor connected between one end of said phaseline and one end of said resonator and a second inductor connected between the other end of said phaseline and the other end of said resonator. As these inductors, the inductance of a wire or via formed within the package can be used, so this does not cause an increase in the size of the splitter circuit. Moreover, the resonance frequency and antiresonance frequency of said resonator are preferably lower than the passband of said transmit filter or higher than the passband of said receive filter. Thus, attenuation poles for the transmit filter and the receive filter appear at the resonance frequencies of the resonator, so the characteristics of the duplexer can be improved.

In a further preferred aspect of the present invention, said at least one phaseline includes a first phaseline with one end connected to said antenna terminal and a second phaseline with one end connected to said receive filter, and said at least one resonator includes a first resonator connected in parallel with said first phaseline and a second resonator connected in parallel with said second phaseline. In this case, it is preferably that said splitter circuit further includes a first inductor connected between said one end of said first phaseline and one end of said first resonator, a second inductor connected between the other end of said first phaseline and the other end of said first resonator, a third inductor connected between said one end of said second phaseline and one end of said second resonator, and a fourth inductor connected between the other end of said second phaseline and the other end of said second resonator. Furthermore, said at least one resonator preferably further includes a third resonator connected between the ground and the point of connection between said second inductor and said fourth inductor. Thereby, the lower edge of the passband of the receive filter can be made extremely sharp, so the characteristics of the duplexer can be greatly improved.

In a further preferred aspect of the present invention, the resonance frequencies of said first and second resonators are preferably lower than the antiresonance frequency of said third resonator, and the effective coupling coefficient of said third resonator is preferably less than the effective coupling coefficients of said first and second resonators. According to this aspect of the present invention, the characteristics of the duplexer can be greatly improved.

In addition, said resonator preferably is constituted of a film bulk acoustic resonator. Thereby, not only can the splitter circuit be made more compact in size but better electric power resistance can be achieved.

With the present invention in this manner, it is possible to make the length of the phaseline contained in the splitter circuit much shorter than in the prior art, so the entire duplexer can be made more compact in size. In addition, attenuation poles corresponding to the resonance frequencies of the resonators can be generated, so the characteristics of the duplexer can be improved.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Before describing details of the preferred embodiment of the present invention, the basic constitution of a duplexer will be first described.

Figure 1:
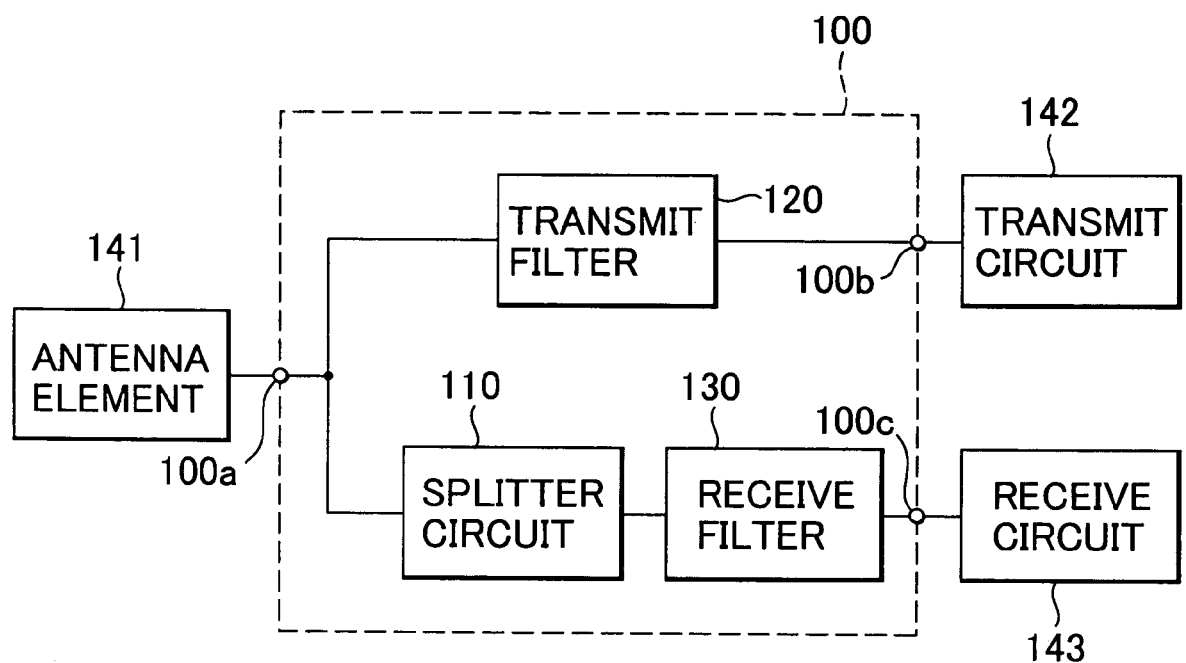
FIG. 1 is a block diagram of the basic configuration of a duplexer.

FIG. 1 is a block diagram of the basic configuration of a duplexer 100.

As shown in FIG. 1, the duplexer 100 includes a transmit filter 120 connected between an antenna terminal 100a and a transmit terminal 100b, and a splitter circuit 110 and receive filter 130 connected in series between the antenna terminal 100a and a receive terminal 100c. When in actual use, as shown in FIG. 1, the antenna terminal 100a is connected to an antenna element 141, the transmit terminal 100b is connected to a transmit circuit 142 and the receive terminal 100c is connected to a receive circuit 143. Thereby, receive signals received via the antenna element 141 are supplied to the receive circuit 143 without reaching the transmit circuit 142, and transmit signals sent from the transmit circuit 142 are sent to the antenna element 141 without reaching the receive circuit 143.

Preferred embodiments of the present invention will now be explained in detail with reference to the drawings.

Figure 2:
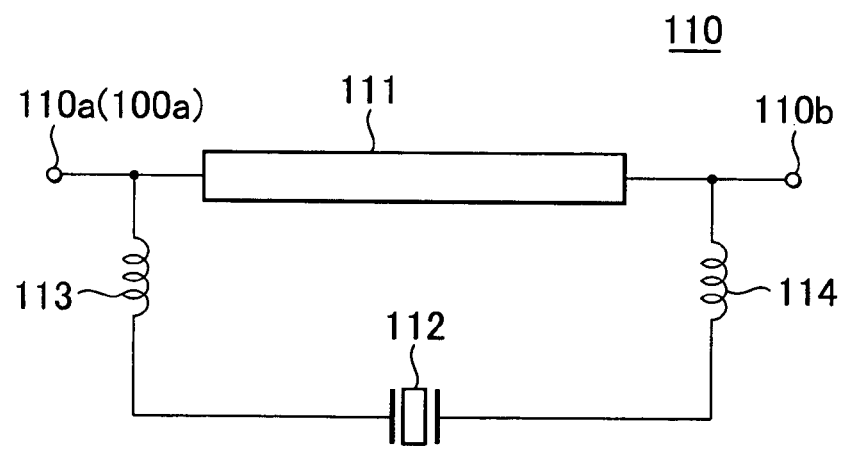
FIG. 2 is a circuit diagram of a specific circuit configuration of a splitter circuit used in a duplexer shown in FIG. 1 according to a preferred embodiment of the present invention.

FIG. 2 is a circuit diagram of a specific circuit configuration of a splitter circuit 110 used in a duplexer 100 according to a preferred embodiment of the present invention.

As shown in FIG. 2, the splitter circuit 110 includes a phaseline 111 connected between its input end 110a (=antenna terminal 100a) and its output end 110b, a resonator 112 connected in parallel with the phaseline 111, a first inductor 113 connected between the resonator 112 and input end 110a, and a second inductor 114 connected between the resonator 112 and output end 110b. As the inductors 113 and 114, the inductance of a wire or via formed within the package can be used.

By adopting such a circuit configuration, it is possible to make the length of the phaseline 111 much shorter than when a quarter-wavelength phaseline is used as in the prior-art splitter circuit. Specifically, it is possible to make the length of the phaseline 111 approximately one-tenth of a wavelength, so the duplexer 100 can be made more compact in size than in the prior art. While a film bulk acoustic resonator or surface acoustic wave resonator can be used as the resonator 112, among these it is preferable to use a film bulk acoustic resonator. This is because if a film bulk acoustic resonator is used as the resonator 112, not only can the splitter circuit 110 be made more compact in size but also it is possible to obtain a high power durability.

Here, it is necessary to set the resonance frequency and antiresonance frequency of the resonator 112 different from the passbands of the transmit filter 120 and receive filter 130. Specifically, in a system in which the passband of the receive filter 130 is higher than the passband of the transmit filter 120, it is preferable to set the resonance frequency and antiresonance frequency of the resonator 112 lower than the passband of the transmit filter 120. If the resonance frequency and antiresonance frequency of the resonator 112 are set in this manner, then attenuation poles corresponding to the resonance frequencies of the resonator 112 appear in the transmit filter 120 and receive filter 130. Thereby, the characteristics of the duplexer can be improved in comparison to the case that the splitter circuit is constituted using a quarter-wavelength phaseline.

Figure 3:
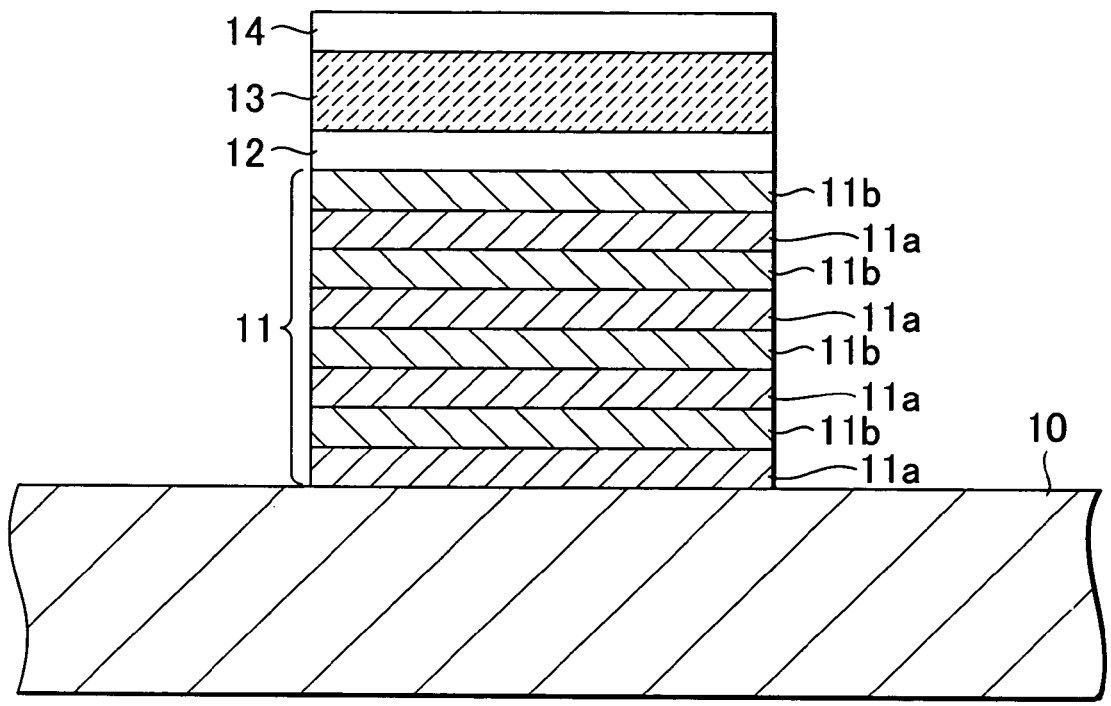
FIG. 3 is a cross section showing the structure of a thin-film bulk acoustic wave resonator which is preferably used as a resonator shown in FIG. 2.

FIG. 3 is a cross section showing the structure of a film bulk acoustic resonator which is preferably used as a resonator 112.

As shown in FIG. 3, the film bulk acoustic resonator preferably used as the resonator 112 includes a substrate 10, an acoustic multilayer 11 provided upon the substrate 10, a lower electrode 12 provided upon the acoustic multilayer 11, a piezoelectric film 13 provided upon the lower electrode 12 and an upper electrode 14 provided upon the piezoelectric film 13, while the first inductor 113 shown in FIG. 2 is connected to one of the lower electrode 12 and upper electrode 14 and the second inductor 114 is connected to the other one.

The substrate 10 serves the role of a base that gives the film bulk acoustic resonator mechanical strength, being made of silicon (Si), sapphire or other monocrystalline substrate, alumina, AlTiC or other ceramic substrate, a quartz substrate or glass substrate or the like. Among these, it is most preferable to use monocrystalline silicon substrate which is inexpensive and for which advanced wafer processes are established.

The acoustic multilayer 11 has a structure constituted of alternately laminated reflective films 11a and 11b made of materials that are different from each other, serving the role of improving the characteristics of the film bulk acoustic resonator by reflecting vibrations propagating in the direction of the substrate 10. While there is no particular limit to the number of reflective layers making up the acoustic multilayer 11, in this example, four pairs of reflective films 11a and 11b are laminated. The materials used for the reflective films 11a and 11b are not particularly limited as long as the acoustic impedance of reflective film 11a is higher than that of reflective film 11b, and among the paired reflective films 11a and 11b, it is preferable to use aluminum nitride (AlN) for the reflective film 11a positioned on the substrate 10 side, and preferable to use silicon oxide ($SiO_2$) for the reflective film 11b positioned on the lower electrode 12 side. Regarding the thickness of reflective films 11a and 11b, this may be set appropriately depending on the target resonance frequency, being preferably set to approximately one-quarter of the wavelength, respectively. The wavelength referred to here is defined by the ratio of the speed of sound of the bulk acoustic waves to the target resonance frequency (speed of sound/resonance frequency).

The lower electrode 12 is used as one electrode of the film bulk acoustic resonator and also is the under layer for the piezoelectric film 13 at the time of fabrication. The lower electrode 12 is preferably a metallic thin film formed by disposing platinum (Pt), gold (Au), iridium (Ir), palladium (Pd), rhodium (Rh), or other material having a face-centered structure with a single orientation upon a (111) surface, or a metallic thin film formed by disposing osmium (Os), rhenium (Re), ruthenium (Ru) or other material having a hexagonal closest packed structure with a single orientation upon a (0001) surface. This is because the crystallinity of the piezoelectric material formed thereupon by an epitaxial growth becomes extremely good. As the lower electrode 12, it is also possible to use a metallic thin film of molybdenum (Mo), tungsten (W) or other material with a body-centered structure, or $SrRuO_3$ or other oxide conductor thin film with a perovskite structure. The thickness of the lower electrode 12 may be set depending on the target resonance frequency, being preferably set to approximately one-tenth of the wavelength.

The piezoelectric film 13 serves the role of converting the electrical signals applied between the lower electrode 12 and the upper electrode 14 into bulk acoustic waves and the material used for it may be ZnO, AlN, GaN or other piezoelectric material having a wurtzite crystal structure. The thickness of the piezoelectric film 13 may be set depending on the target resonance frequency, being preferably set to approximately one-half of the wavelength.

The upper electrode 14 is used as the other electrode of the film bulk acoustic resonator and the material used therefor may be aluminum (Al), gold (Au), platinum (Pt) or other metal or alloys of these metals with copper (Cu) or the like, or a multilayer formed by laminating these metals with titanium (Ti) or other metal may also be used. The thickness of the upper electrode 14 may be set depending on the target resonance frequency, being preferably set to approximately one-tenth of the wavelength.

Figure 4:
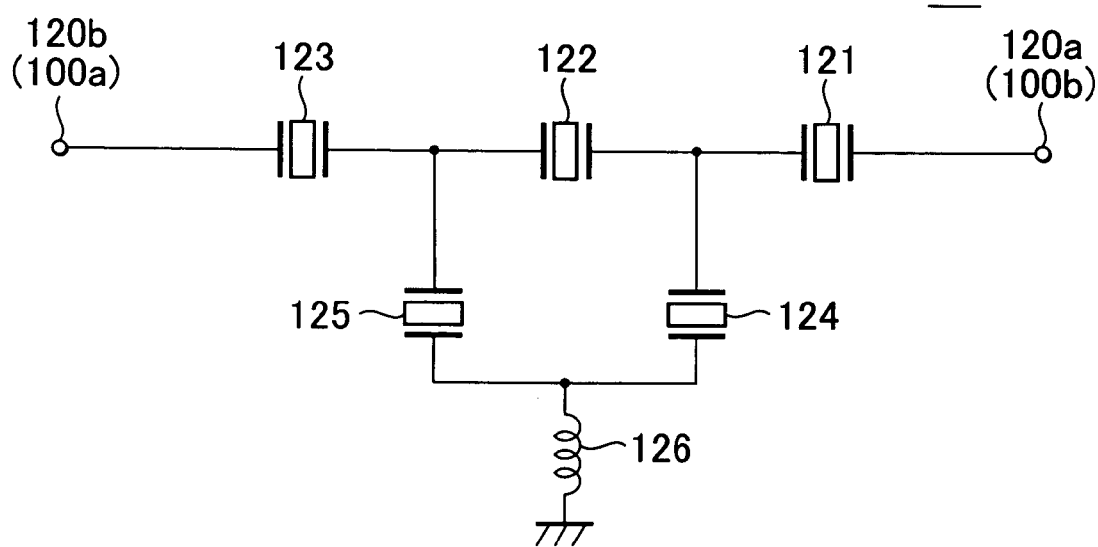
FIG. 4 is a circuit diagram showing one example of a specific constitution of a transmit filter shown in FIG. 1.

FIG. 4 is a circuit diagram showing one example of a specific constitution of a transmit filter 120.

The transmit filter 120 according to the example shown in FIG. 4 includes resonators 121 to 123 connected in series between its input end 120a (=transmit terminal 100b) and its output end 120b (=antenna terminal 100a), a resonator 124 with one end connected to the point of connection between resonator 121 and resonator 122, a resonator 125 with one end connected to the point of connection between resonator 122 and resonator 123 and an inductor 126 with one end connected in common to the other end of the resonator 124 and the other end of the resonator 125 and the other end connected to ground. Thereby, the transmit filter 120 shown in FIG. 4 has a two-stage T filter circuit structure having a serial arm made up of the resonators 121 to 123 and two parallel arms made up of the resonators 124 and 125. Note that the resonance frequency of the serial-arm resonators must be set to the same as or somewhat higher than the antiresonance frequency of the parallel-arm resonators. While there are no particular limitations as to the resonators used for these resonators 121 to 125, film bulk acoustic resonators are preferably used.

The number of stages of the T filter circuit making up the transmit filter 120 is not limited to the example illustrated here, as it may be one stage or three or more stages, but the resonators making up the serial arms must have nearly the same resonance frequency for the resonators of each, and the resonators making up the parallel arms must also have nearly the same resonance frequency for the resonators of each.

Figure 5:
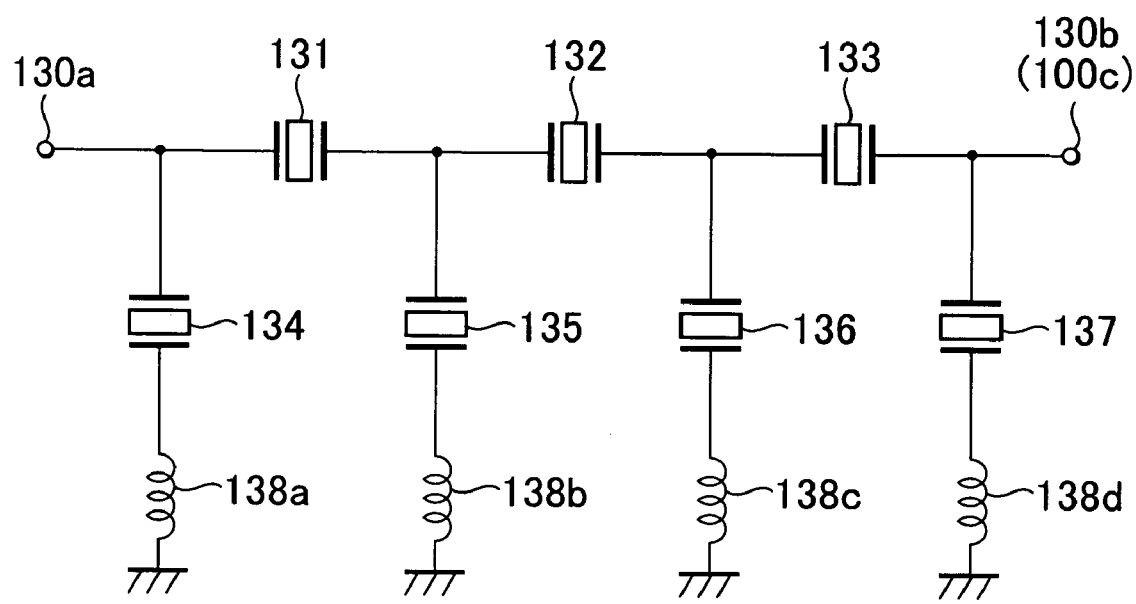
FIG. 5 is a circuit diagram showing one example of a specific constitution of a receive filter shown in FIG. 1.

FIG. 5 is a circuit diagram showing one example of a specific constitution of a receive filter 130.

The receive filter 130 according to the example shown in FIG. 5 includes resonators 131 to 133 connected in series between its input end 130a and its output end 130b (=receive terminal 100c), a resonator 134 with one end connected to the input end 130a, a resonator 135 with one end connected to the point of connection between resonator 131 and resonator 132, a resonator 136 with one end connected to the point of connection between resonator 132 and resonator 133, a resonator 137 with one end connected to the output end 130b and inductors 138a to 138d each with one end connected to associated one of the resonators 134 to 137 and the other end connected to ground. Thereby, the receive filter 130 shown in FIG. 5 has a three-stage π filter circuit structure having a serial arm made up of the resonators 131 to 133 and four parallel arms made up of the resonators 134 to 137. Note that the resonance frequency of the serial-arm resonators must be set to the same as or somewhat higher than the antiresonance frequency of the parallel-arm resonators. For these resonators 131 to 137 also, while there are no particular limitations as to the resonators used for them, film bulk acoustic resonators are preferably used.

Figure 6:
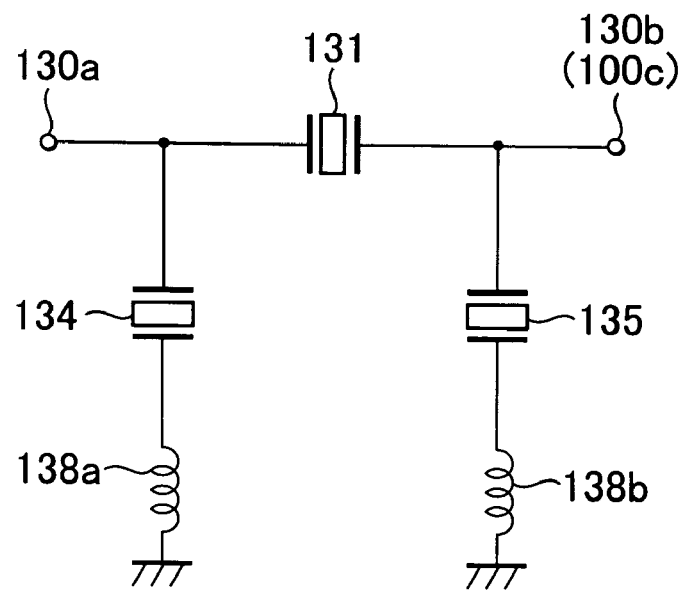
FIG. 6 is a circuit diagram showing another example of a specific constitution of a receive filter shown in FIG. 1.

The number of stages of the π filter circuit making up the receive filter 130 is not limited to the example illustrated here, as it may be one stage as illustrated in FIG. 6 or two or four or more stages, but the resonators making up the serial arms must have nearly the same resonance frequency for the resonators of each, and the resonators making up the parallel arms must also have nearly the same resonance frequency for the resonators of each.

Figure 7:
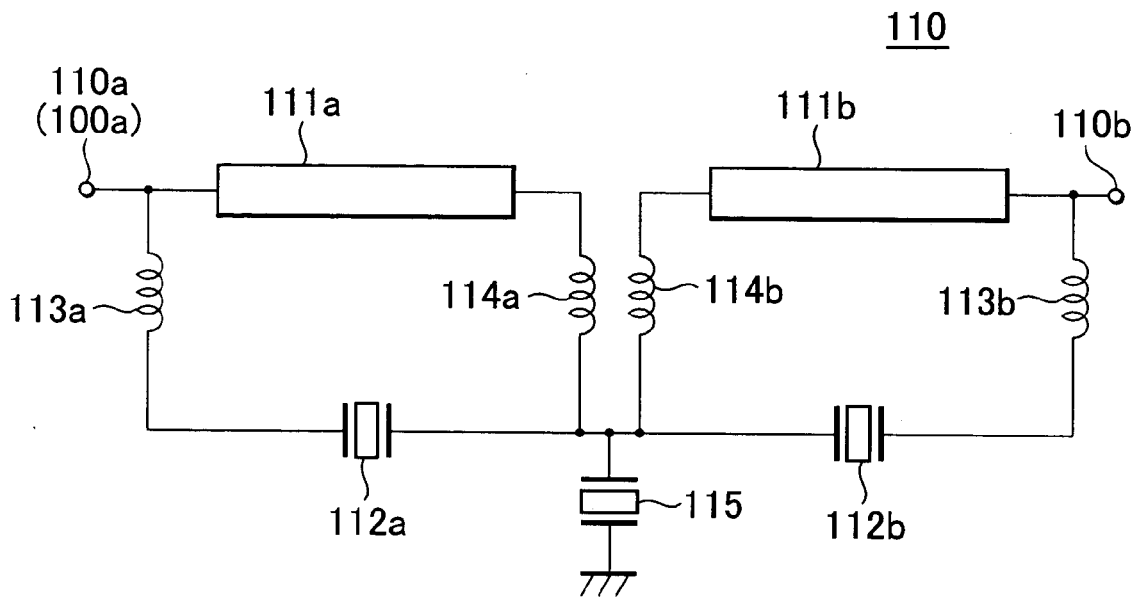
FIG. 7 is a circuit diagram of another specific circuit configuration of a splitter circuit used in a duplexer shown in FIG. 1 according to a preferred embodiment of the present invention.

FIG. 7 is a circuit diagram of another specific circuit configuration of a splitter circuit 110 used in a duplexer 100 according to a preferred embodiment of the present invention.

The splitter circuit 110 shown in FIG. 7 includes a first phaseline 111a with one end connected to its input end 110a (=antenna terminal 100a), a second phaseline 111b with one end connected to its output end 110b, a first resonator 112a connected in parallel with the first phaseline 111a, a second resonator 112b connected in parallel with the second phaseline 111b. The splitter circuit 110 shown in FIG. 7 further includes a first inductor 113a connected between the one end of the first phaseline 111a (=input end 110a) and one end of the first resonator 112a, a second inductor 114a connected between the other end of the first phaseline 111a and the other end of the first resonator 112a, a third inductor 113b connected between one end of the second phaseline 111b (=output end 110b) and one end of the second resonator 112b, a fourth inductor 114b connected between the other end of the second phaseline 111b and the other end of the second resonator 112b and a third resonator 115 connected between ground and the point of connection between the second inductor 114a and the fourth inductor 114b. As the inductors 113a, 114a, 113b and 114b, the inductance of a wire or via formed within the package can be used.

Here, the resonance frequency of the first and second resonators 112a and 112b is set lower than the antiresonance frequency of the third resonator 115, and the effective coupling coefficient of the third resonator 115 is less than (preferably approximately half of) the effective coupling coefficients of the first and second resonators 112a and 112b. Moreover, the resonance frequency of the third resonator 115 is preferably set in the vicinity of or slightly lower than the resonance frequency of the parallel-arm resonators (134 to 137) contained within the receive filter 130. Note that as the resonators 112a, 112b and 115, it is preferable to use a film bulk acoustic resonator having the structure shown in FIG. 3.

By adopting such a circuit configuration, it is possible to make the sum of the lengths of the first phaseline 111a and the second phaseline 111b shorter than those in the prior-art splitter circuit in which a quarter-wavelength phaseline is used. Specifically, it is possible to make the sum of the lengths of the first phaseline 111a and the second phaseline 111b approximately one-seventh of a wavelength, so the duplexer 100 can be made more compact in size than in the prior art.

Moreover, by adopting the circuit configuration shown in FIG. 7 as the splitter circuit 110, the lower edge of the passband of the receive filter 130 can be made extremely sharp, so the characteristics of the duplexer can be greatly improved. These characteristics can be obtained because the inductor connected to the other end of the first phaseline 111a (the second inductor 114a) and the inductor connected to the other end of the second phaseline 111b (the fourth inductor 114b) are provided independently, not shared. If they are shared, the effect of making the lower edge of the passband of the receive filter 130 sharp cannot be obtained.

As described above, the duplexer 100 according to this embodiment uses an improved splitter circuit 110, so high performance can be obtained with a compact size.

The present invention has thus been shown and described with reference to specific embodiments. However, it should be noted that the present invention is in no way limited to the details of the described arrangements but changes and modifications may be made without departing from the scope of the appended claims.

WORKING EXAMPLES

Here follows a description of working examples of the present invention, but the present invention is in no way limited to these examples.

Example 1

A duplexer 100 was fabricated using the circuit shown in FIG. 2 as the splitter circuit 110, the circuit shown in FIG. 4 (the two-stage T filter circuit) as the transmit filter 120, and the circuit shown in FIG. 5 (the three-stage π filter circuit) as the receive filter 130, where the central frequency on the transmit side is 1.88 GHz, the central frequency on the receive side is 1.96 GHz with a passband width of 60 MHz each.

As the phaseline 111 contained within the splitter circuit 110, a stripline with a length of approximately 6 mm formed within an LTCC package with a dielectric constant of approximately 7 was used. Note that if the dielectric constant of the substrate is 7, then the line length of one wavelength at 1.9 GHz is about 60 mm, so the length of the phaseline 111 is one-tenth of one wavelength. In addition, as the resonator 112 contained in the splitter circuit 110, a film bulk acoustic resonator having the structure shown in FIG. 3 is used and its resonance frequency and antiresonance frequency are set to 1.76 GHz and 1.80 GHz, respectively, which are lower than the passband of the transmit filter 120. Moreover, the inductance of the inductors 113 and 114 were set to 0.45 nH.

In addition, regarding the resonators 121 to 125 that make up the transmit filter 120, film bulk acoustic resonators having the structure shown in FIG. 3 are used, the resonator 121 to 123 that make up the series arm had their resonance frequency set to 1.89 GHz and their antiresonance frequency set to 1.925 GHz, while the resonators 124 and 125 that make up the parallel arm had their resonance frequency set to 1.85 GHz and their antiresonance frequency set to 1.89 GHz. Moreover, the inductance of the inductor 126 was set to 2.9 nH.

Moreover, regarding the resonators 131 to 137 that make up the receive filter 130 also, film bulk acoustic resonators having the structure shown in FIG. 3 are used, the resonators 131 to 133 that make up the series arm had their resonance frequency set to 1.98 GHz and their antiresonance frequency set to 2.03 GHz, while the resonators 134 to 137 that make up the parallel arm had their resonance frequency set to 1.914 GHz and their antiresonance frequency set to 1.962 GHz. Moreover, the inductance of the inductors 138a to 138d were set to 0.3 nH, 0.3 nH, 0.9 nH, and 2.7 nH, respectively.

Figure 8:
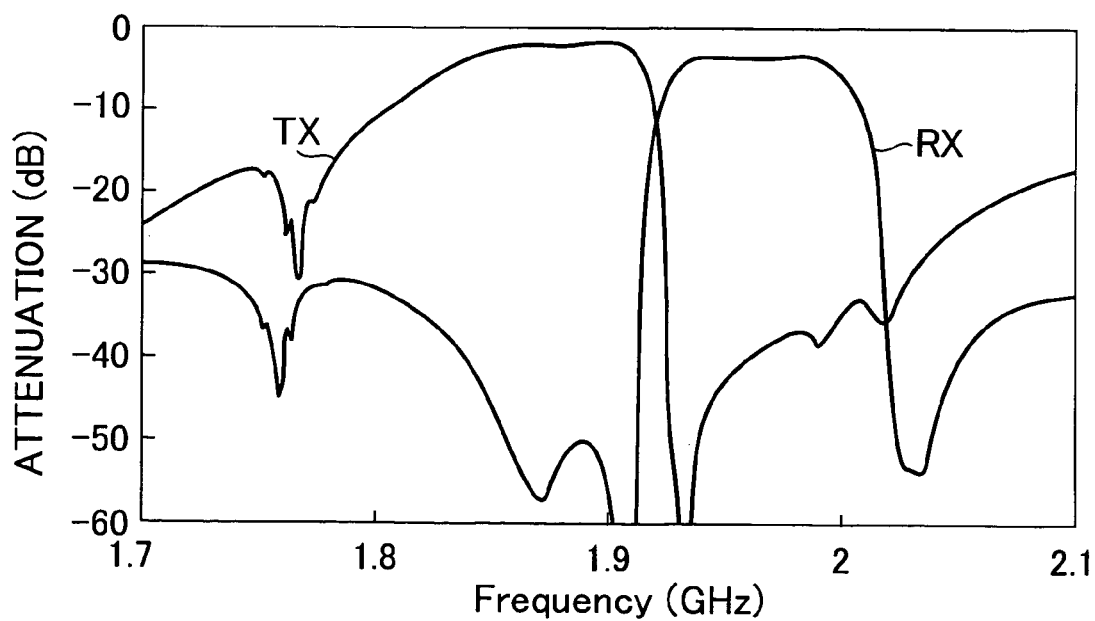
FIG. 8 is a graph of the characteristics of the duplexer according to Example 1.

FIG. 8 is a graph of the characteristics of the duplexer according to this example. In FIG. 8, "TX" indicates the transmit signal characteristics while "RX" indicates the receive signal characteristics (the same goes for FIG. 9). As shown in FIG. 8, resonator 112 is connected in parallel to phaseline 111 in this example, so one can see that attenuation poles appear in the transmit signal characteristic TX and receive signal characteristic RX at frequencies corresponding to the resonance and antiresonance of the resonator 112.

Example 2

A duplexer 100 was fabricated using the circuit shown in FIG. 7 as the splitter circuit 110, the circuit shown in FIG. 4 (the two-stage T filter circuit) as the transmit filter 120, and the circuit shown in FIG. 6 (the one-stage π filter circuit) as the receive filter 130, where the central frequency on the transmit side is 1.88 GHz, the central frequency on the receive side is 1.96 GHz with a passband width of 60 MHz each.

As the phaselines 111a and 111b contained within the splitter circuit 110, striplines with lengths of approximately 3.6 mm and 5.4 mm formed within an LTCC package with a dielectric constant of approximately 7 was used. As described above, if the dielectric constant of the substrate is 7, then the line length of one wavelength at 1.9 GHz is about 60 mm, so the length of phaseline 111a is 0.06 wavelength and the-length of phaseline 111b is 0.09 wavelength. In addition, as the resonators 112a, 112b and 115 contained in the splitter circuit 110, film bulk acoustic resonators having the structure shown in FIG. 3 are used, their resonance frequency is set to 1.927 GHz and their antiresonance frequency is set to 1.981 GHz. Moreover, the inductance of the inductors 113a, 114a, 113b and 114b were set to 0.45 nH.

The transmit filter 120 has the exact same structure as in Example 1.

The receive filter 130 also has the exact same structure as in Example 1.

Figure 9:
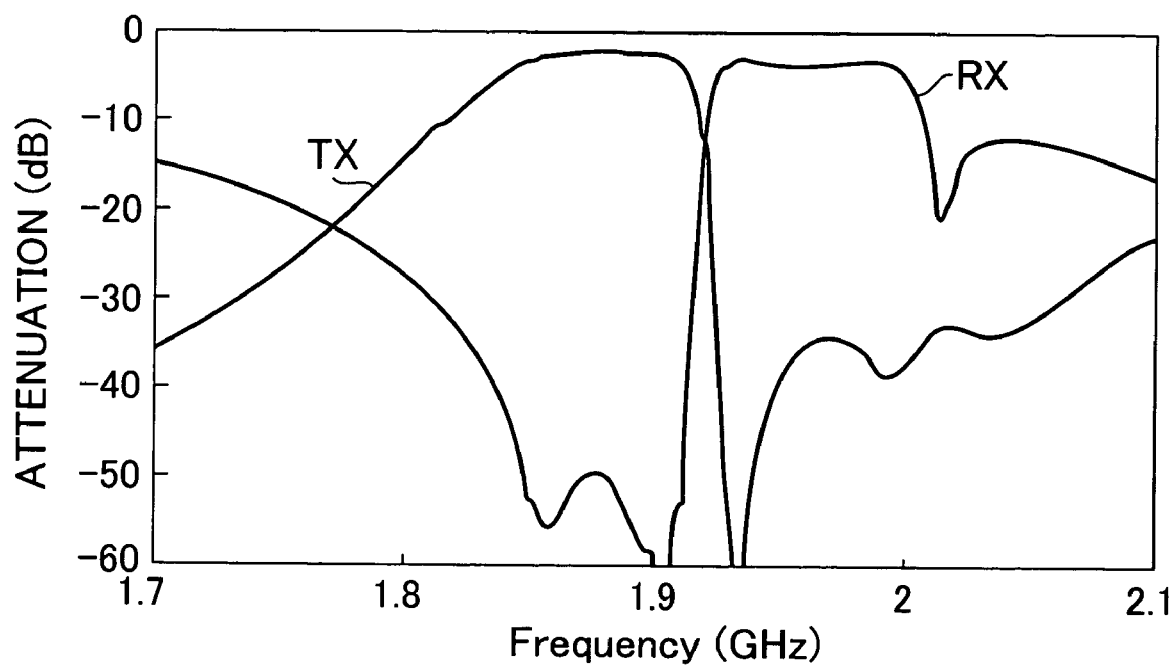
FIG. 9 is a graph of the characteristics of the duplexer according to Example 2.

FIG. 9 is a graph of the characteristics of the duplexer according to this example. As shown in FIG. 9, so one can see that the lower edge of the passband of the receive signal characteristic RX is extremely sharp. As described above, this effect is due to the second inductor 114a and fourth inductor 114b being provided independently without being shared.

What is claimed is:

1. A duplexer having an antenna terminal, a transmit terminal and a receive terminal, comprising:
   a transmit filter connected between said antenna terminal and said transmit terminal; and
   a splitter circuit and a receive filter connected in series between said antenna terminal and said receive terminal, said splitter circuit including at least one phaseline connected between said antenna terminal and said receive filter and at least one resonator connected in parallel with said phaseline, said splitter circuit further including a first inductor connected between one end of said phaseline and one end of said at least one resonator and a second inductor connected between the other end of said phaseline and the other end of said at least one resonator.

2. The duplexer as claimed in claim 1, wherein said at least one resonator is a surface acoustic wave resonator.

3. The duplexer as claimed in claim 1, wherein a resonance frequency and an antiresonance frequency of said at least one resonator are lower than a passband of said transmit filter.

4. The duplexer as claimed in claim 3, wherein said resonance frequency and antiresonance frequency of said at least one resonator are lower than a passband of said receive filter.

5. The duplexer as claimed in claim 1, wherein a resonance frequency and an antiresonance frequency of said at least one resonator are higher than a passband of said receive filter.

6. The duplexer as claimed in claim 5, wherein said resonance frequency and antiresonance frequency of said at least one resonator are higher than a passband of said transmit filter.

7. The duplexer as claimed in claim 1, wherein said at least one phaseline includes a first phaseline with one end connected to said antenna terminal and a second phaseline with one end connected to said receive filter, and said at least one resonator includes a first resonator connected in parallel with said first phaseline and a second resonator connected in parallel with said second phaseline.

8. The duplexer as claimed in claim 7, wherein said splitter circuit further includes said first inductor connected between said one end of said first phaseline and one end of said first resonator, said second inductor connected between the other end of said first phaseline and the other end of said first resonator, a third inductor connected between said one end of said second phaseline and one end of said second resonator, and a fourth inductor connected between the other end of said second phaseline and the other end of said second resonator.

9. The duplexer as claimed in claim 8, wherein said at least one resonator further includes a third resonator connected between a ground and a point of connection between said second inductor and said fourth inductor.

10. The duplexer as claimed in claim 9, wherein said resonance frequencies of said first and second resonators are lower than an antiresonance frequency of said third resonator.

11. The duplexer as claimed in claim 10, wherein an effective coupling coefficient of said third resonator is less than an effective coupling coefficients of said first and second resonators.

12. The duplexer as claimed in claim 9, wherein an effective coupling coefficient of said third resonator is less than an effective coupling coefficients of said first and second resonators.

13. The duplexer as claimed in claim 1, wherein said at least one resonator is a film bulk acoustic resonator.

14. A duplexer having an antenna terminal, a transmit terminal and a receive terminal, composing:

a transmit filter connected between said antenna terminal and said transmit terminal; and a splitter circuit and a receive filter connected in series between said antenna terminal and said receive terminal, said splitter circuit including at least one phaseline connected between said antenna terminal and said receive filter and at least one resonator connected in parallel with said phaseline, a resonance frequency and an antiresonance frequency of said at least one resonator being lower than a passband of said transmit filter.

15. A duplexer having an antenna terminal, a transmit terminal and a receive terminal, comprising:

a transmit filter connected between said antenna terminal and said transmit terminal; and a splitter circuit and a receive filter connected in series between said antenna terminal and said receive terminal, said splitter circuit including at least one phaseline connected between said antenna terminal and said receive filter and at least one resonator connected in parallel with said phaseline, a resonance frequency and an antiresonance frequency of said at least one resonator being higher than a passband of said receive filter.

16. A duplexer having an antenna terminal, a transmit terminal and a receive terminal, comprising:

a transmit filter connected between said antenna terminal and said transmit terminal; and a splitter circuit and a receive filter connected in series between said antenna terminal and said receive terminal, said splitter circuit including at least one phaseline connected between said antenna terminal and said receive filter and at least one resonator connected in parallel with said phaseline, said at least one phaseline including a first phaseline with one end connected to said antenna terminal and a second phaseline with one end connected to said receive filter, and said at least one resonator including a first resonator connected in parallel with said first phaseline and a second resonator connected in parallel with said second phaseline.

* * * * *